US010602267B2

(12) United States Patent
Grosche et al.

(10) Patent No.: US 10,602,267 B2
(45) Date of Patent: Mar. 24, 2020

(54) SOUND SIGNAL PROCESSING APPARATUS AND METHOD FOR ENHANCING A SOUND SIGNAL

(71) Applicant: Huawei Technologies Co., Ltd., Shenzhen (CN)

(72) Inventors: Peter Grosche, Munich (DE); Karim Helwani, Munich (DE); Christian Schörkhuber, Graz (AT); Franz Zotter, Graz (AT); Robert Höldrich, Graz (AT); Matthias Frank, Graz (AT)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/978,688

(22) Filed: May 14, 2018

(65) Prior Publication Data

US 2018/0262832 A1 Sep. 13, 2018

Related U.S. Application Data

(63) Continuation of application No. PCT/EP2015/076954, filed on Nov. 18, 2015.

(51) Int. Cl.
H04R 3/00 (2006.01)
G10L 25/21 (2013.01)
H03G 3/20 (2006.01)
H04R 1/40 (2006.01)
H04R 3/04 (2006.01)

(52) U.S. Cl.
CPC .............. H04R 3/005 (2013.01); G10L 25/21 (2013.01); H03G 3/20 (2013.01); H04R 1/406 (2013.01); H04R 3/04 (2013.01)

(58) Field of Classification Search
None
See application file for complete search history.

(56) References Cited

U.S. PATENT DOCUMENTS 6,549,630 B1   4/2003   Bobisuthi
7,924,655 B2   4/2011   Liu et al.
(Continued)

FOREIGN PATENT DOCUMENTS

CN   1837846 A   9/2006
CN   1967658 A   5/2007
(Continued)

OTHER PUBLICATIONS

Machine Translation and Abstract of Japanese Publication No. JPH11249693, Sep. 17, 1999, 8 pages.
(Continued)

Primary Examiner — Paul W Huber
(74) Attorney, Agent, or Firm — Conley Rose, PC.

(57) ABSTRACT

A sound signal processing apparatus including a plurality of microphones, where each microphone is configured to receive the sound signal from the target source, a processor configured to estimate a first power measure on the basis of the sound signal from the target source received by a first microphone of the microphones and a second power measure on the basis of the sound signal from the target source received by at least a second microphone of the microphones, which is located more distant from the target source than the first microphone, and the processor is further configured to determine a gain factor on the basis of a ratio between the second power measure and the first power measure, and an amplifier configured to apply the gain factor to the sound signal from the target source received by the first microphone.

20 Claims, 12 Drawing Sheets

(56) References Cited

U.S. PATENT DOCUMENTS

| | | | |
|---|---|---|---|
| 8,121,835 B2 | 2/2012 | Archibald | |
| 9,202,455 B2* | 12/2015 | Park | G10K 11/178 |
| 2006/0215854 A1 | 9/2006 | Suzuki et al. | |
| 2011/0288864 A1 | 11/2011 | Kechichian et al. | |

FOREIGN PATENT DOCUMENTS

| | | |
|---|---|---|
| CN | 101778322 A | 7/2010 |
| CN | 102081925 A | 6/2011 |
| JP | H11249693 A | 9/1999 |
| JP | 3435686 B2 | 8/2003 |

OTHER PUBLICATIONS

Braun, S., et al., "Automatic Spatial Gain Control for an Informed Spatial Filter," IEEE International Conference on Acoustic, Speech and Signal Processing (ICASSP), 2014, pp. 830-834.

Liu, Z., et al, "Energy-Based Sound Source Localization and Gain Normalization for AD HOC Microphone Arrays," ICASSP 2007, 2007, 4 pages.

Foreign Communication From a Counterpart Application, PCT Application No. PCT/EP2015/076954, International Search Report dated Feb. 17, 2016, 5 pages.

Machine Translation and Abstract of Chinese Publication No. CN1967658, dated May 23, 2007, 11 pages.

Machine Translation and Abstract of Chinese Publication No. CN101778322, dated Jul. 14, 2010, 23 pages.

Machine Translation and Abstract of Japanese Publication No. JP3435686, dated Aug. 11, 2003, 15 pages.

Foreign Communication From a Counterpart Application, Chinese Application No. 201580084540.5, Chinese Search Report dated Jan. 16, 2020, 3 pages.

Foreign Communication From a Counterpart Application, Chinese Application No. 201580084540.5, Chinese Office Action dated Feb. 3, 2020, 3 pages.

\* cited by examiner

SOUND SIGNAL PROCESSING APPARATUS AND METHOD FOR ENHANCING A SOUND SIGNAL

CROSS-REFERENCE TO RELATED APPLICATIONS

This application is a continuation of International Patent Application No. PCT/EP2015/076954 filed on Nov. 18, 2015, which is hereby incorporated by reference in its entirety.

TECHNICAL FIELD

Generally, the present disclosure relates to the field of audio signal processing and reproduction, and in particular, the present disclosure relates to a sound signal processing apparatus and method for enhancing a sound signal.

BACKGROUND

Automatic gain control (AGC) aims at equalizing level variations in recorded speech to ensure a constant level of the speech signal. Analysis of speech signals recorded by microphones reveals that the cause of level variations in recorded speech can be separated into two independent causes, namely intentional speech level variations and unintentional variations, due, for example, to the changes of distance between a speaker and a microphone.

Several AGC systems have been developed in order to equalize level variations. Currently developed AGC solutions are described in U.S. Pat. No. 8,121,835 and "Automatic Spatial Gain Control for an Informed Spatial Filter in Acoustics, Speech and Signal Processing (ICASSP)" Braun, S. et al., E. A. P. (2014), 2014 Institute of Electrical and Electronics Engineers (IEEE) International Conference on (pp. 830-834). They act, however, on both intentional and unintentional signal level fluctuations of the emitted speech energy.

Therefore in order to be able to convey a realistic sound field impression, e.g. for immersive teleconferencing systems, it is of paramount importance to detect the cause of level variations. Doing so would allow for fully equalizing of unintentional variations due to distance fluctuations while preserving intentional (natural) dynamic changes of the speech signals.

The idea of distinguishing between intentional and unintentional signal level variations, and equalizing only the unintentional ones, has recently been investigated from numerous perspectives. One of the solutions that have been proposed is to estimate the talker-microphone distances by acoustic source localization (ASL). Several ASL methods have been developed to equalize level variations arising from distance fluctuations between a source and a microphone for systems with synchronized microphones at known positions and without simultaneously active talkers. Such systems are described in, for example, U.S. Pat. No. 7,924,655 and "Energy-based sound source localization and gain normalization for ad hoc microphone arrays. Acoustics, Speech and Signal Processing", Liu, Z. et al, ICASSP 2007, IEEE International Conference on. Vol. 2. IEEE, 2007.

However, conventional ASL methods exhibit at least one of the following deficiencies. In some conventional ASL methods the microphones have to be synchronized and/or their positions have to be known. Some conventional ASL methods cannot handle simultaneously active talkers. In some conventional ASL methods the large estimation errors do not allow to equalize close-talk level variations. Some conventional ASL methods are computationally complex.

Thus, there is a need for an improved sound signal processing apparatus and method allowing, in particular, for AGC.

SUMMARY

It is an object of the disclosure to provide an improved sound signal processing apparatus and method allowing, in particular, for AGC.

The foregoing and other objects are achieved by the subject matter of the independent claims. Further implementation forms are apparent from the dependent claims, the description and the figures.

According to a first aspect, the disclosure relates to a sound signal processing apparatus for enhancing a sound signal from a target source. The sound signal processing apparatus comprises a plurality of microphones, wherein each microphone is configured to receive the sound signal from the target source, an estimator configured to estimate a first power measure on the basis of the sound signal from the target source received by a first microphone of the plurality of microphones, a second power measure on the basis of the sound signal from the target source received by at least a second microphone of the plurality of microphones, which is located more distant from the target source than the first microphone, wherein the estimator is further configured to determine a gain factor on the basis of a ratio between the second power measure and the first power measure, and an amplifier configured to apply the gain factor to the sound signal from the target source received by the first microphone.

Thus, an improved sound signal processing apparatus is provided allowing for an AGC by equalizing sound signal level fluctuations due to the distance variations between a target source and a microphone in a computationally efficient manner.

In a first possible implementation form of the sound signal processing apparatus according to the first aspect of the disclosure, the estimator is further configured to estimate the first power measure on the basis of a plurality of band-limited power measures in a plurality of frequency bands of the sound signal from the target source received by the first microphone and a plurality of probabilities defining the likelihood of the target source being active in the plurality of frequency bands.

Thus, a more robust equalization of sound signal level fluctuations due to the distance variations between the target source and the first microphone is provided.

In a second possible implementation form of the sound signal processing apparatus according to the first aspect of the disclosure as such or the first implementation form thereof, the estimator is further configured to estimate the first power measure on the basis of the following equation:

$$s_{ii} = p_i^T(n) \cdot \mathrm{diag}\{w\} \cdot x_i(n),$$

wherein $s_{ii}$ denotes the first power measure, w denotes a weighting vector defining a plurality of weights for the plurality of frequency bands, $x_i$ denotes a power measure vector defining the plurality of band-limited power measures in the plurality of frequency bands of the sound signal from the target source received by the first microphone for the time instant n and $p_i(n)$ denotes a probability vector defining the plurality of probabilities for a time instant n on the basis of the following equation:

$$p_i(n) = [P_i(n,1), P_i(n,2), \ldots, P_i(n,K)]^T,$$

wherein $P_i(n,k)$ denotes the probability of the target source being active at the first microphone in a frequency band k at time instant n and wherein K denotes the number of frequency bands.

Thus, a more robust equalization of sound signal level fluctuations due to the distance variations between the target source and the first microphone is provided taking into account likelihoods for the different microphones being active. Depending on the importance of specific frequency bands the plurality of weights allows weighting different frequency bands differently.

The power measure vector defining the plurality of band-limited power measures in the plurality of frequency bands of the sound signal from the target source received by the first microphone during the time instant n can be defined by the following equation:

$$x_i(n) = [|X_i(n,1)|^2, |X_i(n,2)|^2, \ldots, |X_i(n,K)|^2]^T,$$

wherein $X_i(n,k)$ denotes the intensity of the sound signal from the target source received by the first microphone in a frequency band k at time instant n and wherein K denotes the number of frequency bands.

In a third possible implementation form of the sound signal processing apparatus according to the first or the second implementation form of the first aspect, the estimator is configured to determine the plurality of probabilities defining the likelihood of the target source being active in the plurality of frequency bands for each frequency band on the basis of a difference between the first power measure of the sound signal from the target source received by the first microphone and the second power measure of the sound signal from the target source received by the second microphone.

Thus, a more reliable gain control is provided taking into account the likelihood of the target source being active to better separate the signal from the target source from competing sound sources.

In a fourth possible implementation form of the sound signal processing apparatus according to the second or third implementation form of the first aspect, the estimator is further configured to estimate the first power measure using the plurality of probabilities defined by the following equation:

$$P_i(n, k) = \frac{\max\{|X_i(n, k)|^2 - \max_{j \neq i}(|X_j(n, k)|^2), 0\}}{|X_i(n, k)|^2},$$

wherein $P_i(n,k)$ denotes the probability that the target source is active at the first microphone in a frequency band k at time instant n, $X_i(n,k)$ denotes the intensity of the sound signal from the target source received by the first microphone in a frequency band k at time instant n and (n,k) denotes the intensity of the sound signal from the target source received by the j-th microphone in a frequency band k at time instant n.

Thus, a more reliable gain enhancement is provided taking into account the likelihood of the target source being active to better separate the signal from the target source from competing sound sources.

In a fifth possible implementation form of the sound signal processing apparatus according to the first aspect of the disclosure as such or any one of the first to fourth implementation form thereof, the estimator is further configured to estimate the second power measure on the basis of the sound signal received by the first microphone, the sound signal received by the second microphone and the sound signal received by at least one another microphone of the plurality of microphones.

Taking more microphones into account allows obtaining a more reliable estimate for the second power measure and, therefore, an improved value for the gain factor.

In a sixth possible implementation form of the sound signal processing apparatus according to the first aspect of the disclosure as such or the fifth implementation form thereof, the estimator is further configured to estimate the second power measure further on the basis of a plurality of microphone reliability measures, wherein the microphone reliability measure of each microphone of the plurality of microphones depends on the distance of the microphone to the target source and on the ratio of the sound signal from the target source received by the microphone to noise and/or interference signals.

Weighting each microphone by a reliability measure leads to a further improved estimate of the second power measure and, consequently, the gain factor.

In a seventh possible implementation form of the sound signal processing apparatus according to the first aspect of the disclosure as such or any one of the first to sixth implementation form thereof, the ratio between the second power measure and the first power measure is weighted by a normalized measure for the probability that the target source is active at the first microphone during a time instant n.

Thus, an increased robustness and smoothness of the gain control is provided.

In an eighth possible implementation form of the sound signal processing apparatus according to the first aspect of the disclosure as such or the seventh implementation form thereof, the probability that the target source is active at the first microphone during a time instant n is based on a plurality of probabilities that the target source is active at the first microphone during a time instant n for a plurality of frequency bands.

Thus, an increased robustness of the estimate of the probability that the target source is active is obtained.

In a ninth possible implementation form of the sound signal processing apparatus according to the first aspect of the disclosure as such or the eighth implementation form thereof, the estimator is configured to determine the normalized measure for the probability that the target source is active at the first microphone during a time instant n on the basis of the following equation:

$$\mu_i(n) = \frac{w^T p_i(n)}{w^T w},$$

wherein $\mu_i(n)$ denotes the normalized measure for the probability that the target source is active at the first microphone during a time instant n, w denotes a weighting vector defining a plurality of weights for the plurality of frequency bands and $p_i(n)$ denotes a probability vector defining the plurality of probabilities that the target source is active at the first microphone during a time instant n for a plurality of frequency bands.

Thus, an advantageous gain factor smoothing is provided.

In a tenth possible implementation form of the sound signal processing apparatus according to the first aspect of the disclosure as such or the ninth implementation form thereof, the probability vector $p_i(n)$ is defined by the following equation:

$$p_i(n) = [P_i(n,1), P_i(n,2), \ldots, P_i(n,K)]^T,$$

wherein $P_i(n,k)$ denotes the probability of the target source being active at the first microphone in a frequency band k at time instant n, K denotes the number of frequency bands and the probability $P_i(n,k)$ is determined on the basis of the following equation:

$$P_i(n,k) = \frac{\max\{|X_i(n,k)|^2 - \max_{j \neq i}(|X_j(n,k)|^2), 0\}}{|X_i(n,k)|^2}$$

wherein $X_i(n,k)$ denotes the intensity of the sound signal from the target source received by the first microphone in a frequency band k at time instant n and $X_j(n,k)$ denotes the intensity of the sound signal from the target source received by the j-th microphone in a frequency band k at time instant n.

Thus, the probability of the target source being active is efficiently and robustly estimated by considering the intensity of the sound signal.

In an eleventh possible implementation form of the sound signal processing apparatus according to the first aspect of the disclosure as such or any one of the first to tenth implementation form thereof, the amplifier is configured to apply a unity gain factor to the sound signal from the target source received by the first microphone, in case a normalized measure for the probability that the target source is active at the first microphone during a time instant n is smaller than a predefined threshold value.

Thus, a unity gain factor is provided, in case the likelihood of the target source being active is too low.

In a twelfth possible implementation form of the sound signal processing apparatus according to the first aspect of the disclosure as such or any one of the first to eleventh implementation form thereof, the amplifier is configured to apply a unity gain factor to the sound signal from the target source received by the first microphone, in case a normalized measure for the probability that the target source is active at the first microphone during a time instant n is smaller than a predefined probability threshold value, by applying a gating function, a low pass filter and/or a Schmitt trigger to the normalized measure for the probability that the target source is active at the first microphone during a time instant n.

According to a second aspect, the disclosure relates to a sound signal processing method for enhancing a sound signal form a target source. The sound signal processing method comprises the steps of receiving the sound signal from the target source by a plurality of microphones, estimating a first power measure on the basis of the sound signal from the target source received by a first microphone of the plurality of microphones and a second power measure on the basis of the sound signal from the target source received by at least a second microphone of the plurality of microphones, which is located more distant from the target source than the first microphone, determining a gain factor on the basis of a ratio between the second power measure and the first power measure, and applying a gain factor to the sound signal from the target source received by the first microphone.

In a first possible implementation form of the sound signal processing method according to the second aspect of the disclosure, the estimation step comprises estimating the first power measure on the basis of a plurality of band-limited power measures in a plurality of frequency bands of the sound signal from the target source received by the first microphone and a plurality of probabilities defining the likelihood of the target source being active in the plurality of frequency bands.

In a second possible implementation form of the sound signal processing method according to the second aspect of the disclosure as such or the first implementation form thereof, the estimation step comprises estimating the first power measure on the basis of the following equation:

$$s_{ii} = p_i^T(n) \cdot \text{diag}\{w\} \cdot x_i(n),$$

wherein $s_{ii}$ denotes the first power measure, w denotes a weighting vector defining a plurality of weights for the plurality of frequency bands, $x_i$ denotes a power measure vector defining the plurality of band-limited power measures in the plurality of frequency bands of the sound signal from the target source received by the first microphone for the time instant n and $p_i(n)$ denotes a probability vector defining the plurality of probabilities for a time instant n on the basis of the following equation:

$$p_i(n) = [P_i(n,1), P_i(n,2), \ldots, P_i(n,K)]^T,$$

wherein $P_i(n,k)$ denotes the probability of the target source being active at the first microphone in a frequency band k at time instant n and wherein K denotes the number of frequency bands.

The power measure vector defining the plurality of band-limited power measures in the plurality of frequency bands of the sound signal from the target source received by the first microphone during the time instant n can be defined by the following equation:

$$x_i(n) = [|X_i(n,1)|^2, |X_i(n,2)|^2, \ldots, |X_i(n,K)|^2]^T,$$

wherein $X_i(n,k)$ denotes the intensity of the sound signal from the target source received by the first microphone in a frequency band k at time instant n and wherein K denotes the number of frequency bands.

In a third possible implementation form of the sound signal processing method according to the first or the second implementation form of the second aspect, the plurality of probabilities defining the likelihood of the target source being active in the plurality of frequency bands are determined for each frequency band on the basis of a difference between the first power measure of the sound signal from the target source received by the first microphone and the second power measure of the sound signal from the target source received by the second microphone.

In a fourth possible implementation form of the sound signal processing method according to the second or third implementation form of the second aspect, the estimation step comprises estimating the first power measure using the plurality of probabilities defined by the following equation:

$$P_i(n,k) = \frac{\max\{|X_i(n,k)|^2 - \max_{j \neq i}(|X_j(n,k)|^2), 0\}}{|X_i(n,k)|^2},$$

wherein $P_i(n,k)$ denotes the probability that the target source is active at the first microphone in a frequency band k at time instant n, $X_i(n,k)$ denotes the intensity of the sound signal from the target source received by the first microphone in a frequency band k at time instant n and $X_j(n,k)$ denotes the intensity of the sound signal from the target source received by the j-th microphone in a frequency band k at time instant n.

In a fifth possible implementation form of the sound signal processing method according to the second aspect of the disclosure as such or any one of the first to fourth implementation form thereof, the estimation step comprises estimating the second power measure on the basis of the sound signal received by the first microphone, the sound signal received by the second microphone and the sound signal received by at least one further microphone of the plurality of microphones.

In a sixth possible implementation form of the sound signal processing method according to the second aspect of the disclosure as such or the fifth implementation form thereof, the estimation step comprises estimating the second power measure further on the basis of a plurality of microphone reliability measures, wherein the microphone reliability measure of each microphone of the plurality of microphones depends on the distance of the microphone to the target source and on the ratio of the sound signal from the target source received by the microphone to noise and/or interference signals.

In a seventh possible implementation form of the sound signal processing method according to the second aspect of the disclosure as such or any one of the first to sixth implementation form thereof, the step of determining the gain factor on the basis of the ratio between the second power measure and the first power measure comprises weighting the ratio by a normalized measure for the probability that the target source is active at the first microphone during a time instant n.

In an eighth possible implementation form of the sound signal processing method according to the second aspect of the disclosure as such or the seventh implementation form thereof, the probability that the target source is active at the first microphone during a time instant n is based on a plurality of probabilities that the target source is active at the first microphone during a time instant n for a plurality of frequency bands.

In a ninth possible implementation form of the sound signal processing method according to the second aspect of the disclosure as such or the eighth implementation form thereof, the normalized measure for the probability that the target source is active at the first microphone during a time instant n is determined on the basis of the following equation:

$$\mu_i(n) = \frac{w^T p_i(n)}{w^T w},$$

wherein $\mu_i(n)$ denotes the normalized measure for the probability that the target source is active at the first microphone during a time instant n, w denotes a weighting vector defining a plurality of weights for the plurality of frequency bands and $p_i(n)$ denotes a probability vector defining the plurality of probabilities that the target source is active at the first microphone during a time instant n for a plurality of frequency bands.

In a tenth possible implementation form of the sound signal processing method according to the second aspect of the disclosure as such or the ninth implementation form thereof, the probability vector $p_i(n)$ is defined by the following equation:

$$p_i(n) = [P_i(n,1), P_i(n,2), \ldots, P_i(n,K)]^T,$$

wherein $P_i(n,k)$ denotes the probability of the target source being active at the first microphone in a frequency band k at time instant n, K denotes the number of frequency bands and the probability $P_i(n,k)$ is determined on the basis of the following equation:

$$P_i(n,k) = \frac{\max\{|X_i(n,k)|^2 - \max_{j \neq i}(|X_j(n,k)|^2), 0\}}{|X_i(n,k)|^2},$$

wherein $X_i(n,k)$ denotes the intensity of the sound signal from the target source received by the first microphone in a frequency band k at time instant n and $X_j(n,k)$ denotes the intensity of the sound signal from the target source received by the j-th microphone in a frequency band k at time instant n.

In an eleventh possible implementation form of the sound signal processing method according to the second aspect of the disclosure as such or any one of the first to tenth implementation form thereof, the step of applying a gain factor to the sound signal comprises applying a unity gain factor to the sound signal from the target source received by the first microphone, in case a normalized measure for the probability that the target source is active at the first microphone during a time instant n is smaller than a predefined threshold value.

In a twelfth possible implementation form of the sound signal processing method according to the second aspect of the disclosure as such or any one of the first to eleventh implementation form thereof, the step of applying a gain factor to the sound signal comprises applying a unity gain factor to the sound signal from the target source received by the first microphone, in case a normalized measure for the probability that the target source is active at the first microphone during a time instant n is smaller than a predefined probability threshold value, by applying a gating function, a low pass filter and/or a Schmitt trigger to the normalized measure for the probability that the target source is active at the first microphone during a time instant n.

The sound signal processing method according to the second aspect of the disclosure can be performed by the sound signal processing apparatus according to the first aspect of the disclosure. Further features of the sound signal processing method according to the second aspect of the disclosure result directly from the functionality of the sound signal processing apparatus according to the first aspect of the disclosure and its different implementation forms and vice versa.

According to a third aspect the disclosure relates to a computer program comprising program code for performing the sound signal processing method according to the second aspect of the disclosure or any of its implementation forms when executed on a computer.

The disclosure can be implemented in hardware and/or software.

BRIEF DESCRIPTION OF THE DRAWINGS

Further embodiments of the disclosure will be described with respect to the following figures.

In the various figures, identical reference signs will be used for identical or at least functionally equivalent features.

DETAILED DESCRIPTION OF EMBODIMENTS

In the following description, reference is made to the accompanying drawings, which form part of the disclosure, and in which are shown, by way of illustration, specific aspects in which the present disclosure may be placed. It is understood that other aspects may be utilized and structural or logical changes may be made without departing from the scope of the present disclosure. The following detailed description, therefore, is not to be taken in a limiting sense, as the scope of the present disclosure is defined be the appended claims.

For instance, it is understood that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless noted otherwise.

Figure 1:
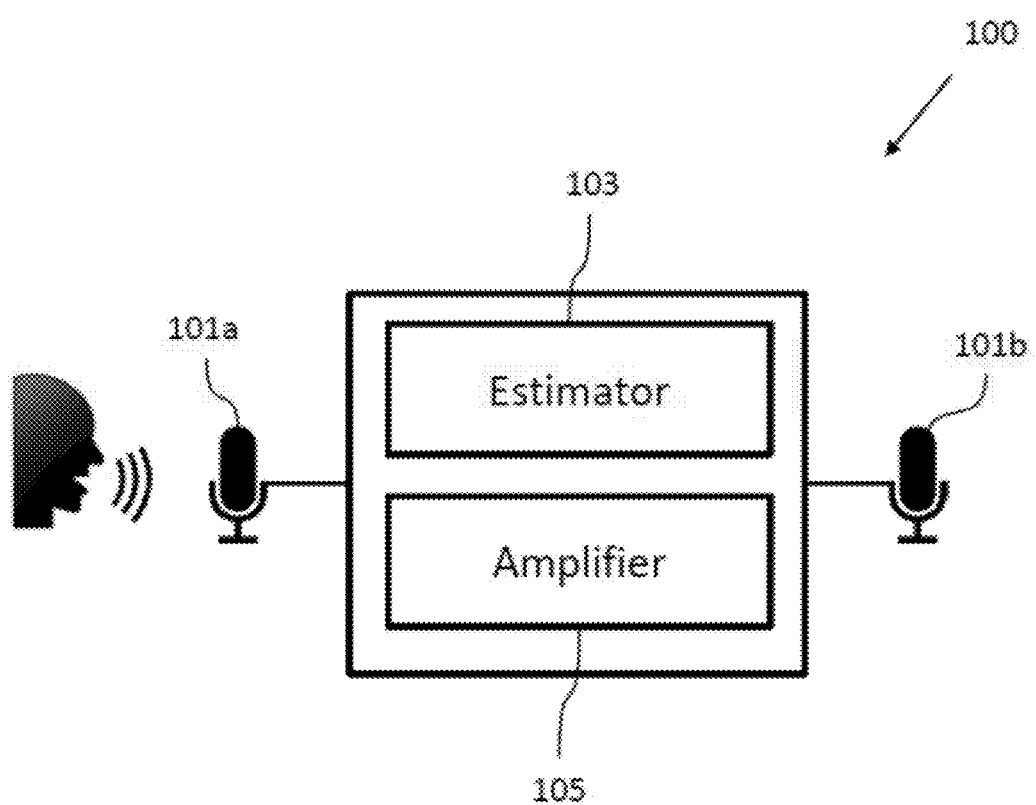
FIG. 1 illustrates a schematic diagram of a sound signal processing apparatus for enhancing a sound signal from a target source according to an embodiment.

FIG. 1 illustrates a schematic diagram of a sound signal processing apparatus 100 for enhancing or equalizing a sound signal from a target source, for instance, a speaker. The sound signal processing apparatus 100 comprises a first microphone 101a configured to receive the sound signal from the target source and a second microphone 101b configured to receive the sound signal from the target source. As illustrated in FIG. 1, the second microphone 101b is located further from the target source than the first microphone 101a.

The sound signal processing apparatus 100 further comprises an estimator 103 configured to estimate a first power measure on the basis of the sound signal from the target source received by the first microphone 101a and a second power measure on the basis of the sound signal from the target source received by the second microphone 101b. The term "power measure" used herein is to be understood as any measure that allows quantifying the strength of the sound signal received from the target source, such as a measure of the intensity, energy and/or power of the sound signal. A power measure may be determined, for instance, on the basis of the squared magnitude, magnitude or root-mean-square of the sound signal. Moreover, determining the power measure may involve a temporal averaging operation.

The estimator 103 is further configured to determine a gain factor on the basis of a ratio between the second power measure and the first power measure.

The sound signal processing apparatus 100 further comprises an amplifier 105 configured to apply the gain factor to the sound signal from the target source received by the first microphone 101a.

Figure 2:
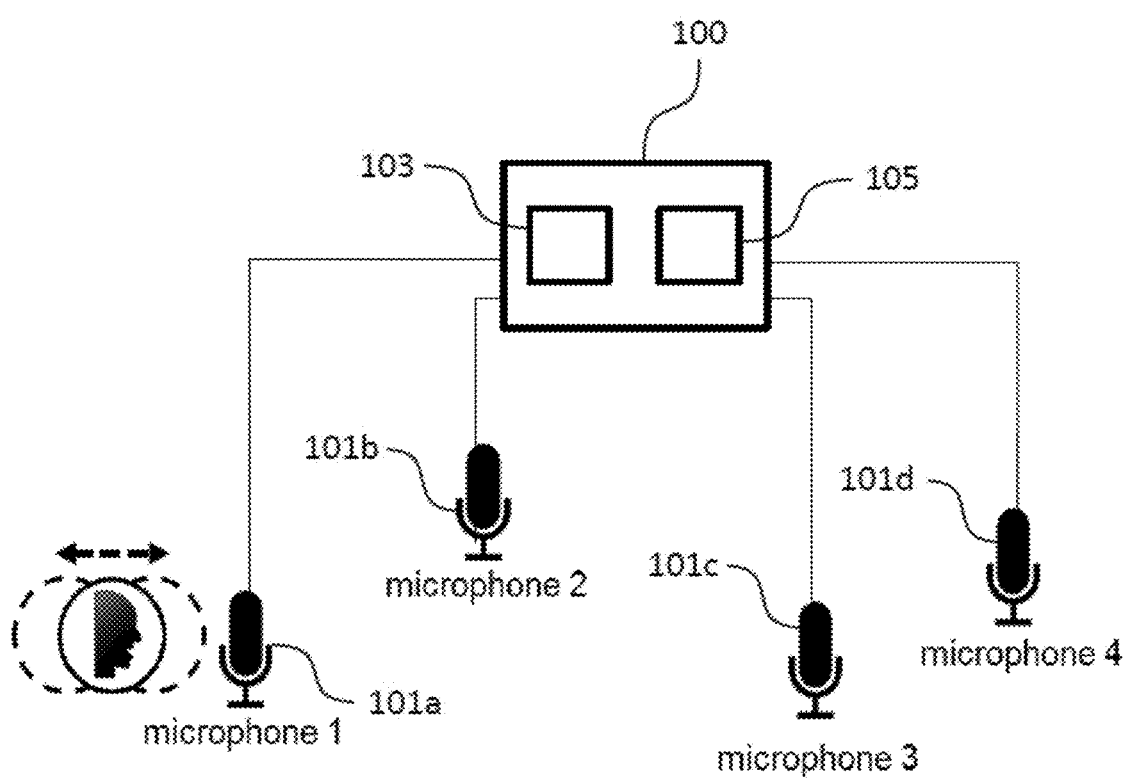
FIG. 2 illustrates a schematic diagram illustrating an exemplary scenario including a sound signal processing apparatus according to an embodiment with four microphones and one target source with varying target source-microphone distances.

FIG. 2 illustrates a schematic diagram illustrating an exemplary scenario including a sound signal processing apparatus 100 according to an embodiment with four microphones 101a-d and a target source with varying source-microphone distance. By way of example, the first microphone 101a is the closest microphone to the target source and the fourth microphone 101d has the largest distance from the target source. It has been found that the short time variations of the signals, recorded by each microphone 101a-d can be decomposed into intentional signal variations, for example the changes of intonation or tone of the voice, and unintentional signal variations, for example due to the distance fluctuations between the target source and the microphones 101a-d.

Figure 3:
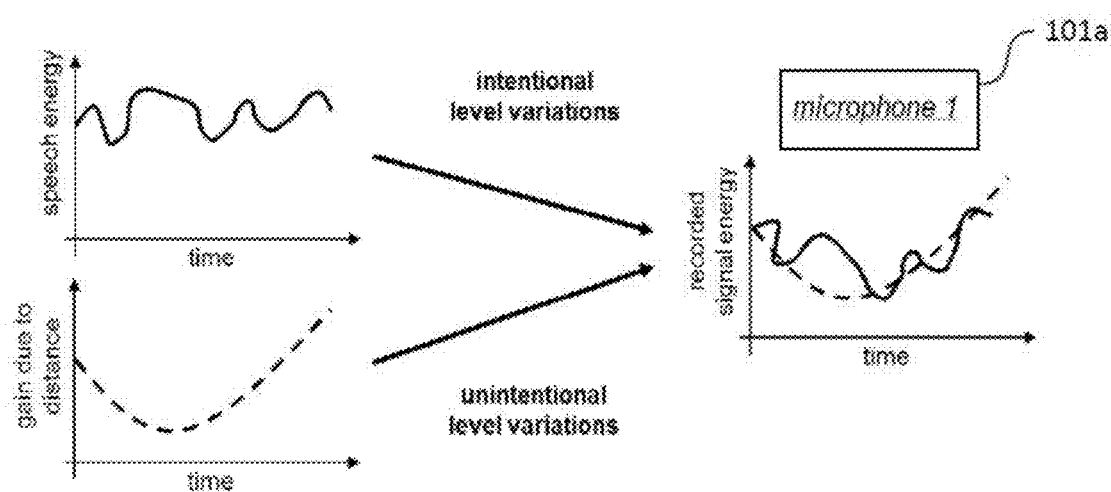
FIG. 3 illustrates a schematic diagram illustrating a decomposition of the signal energy variations as received by a microphone of a sound signal processing apparatus according to an embodiment into intentional level variations and unintentional level variations.

FIG. 3 illustrates a schematic diagram illustrating how the short-time signal energy fluctuations of the sound signal received by the first microphone 101a can be decomposed into short-time energy fluctuations of the sound signal and a time-varying gain due to distance variations between the target source and the first microphone 101a. By way of example, in FIG. 3 and some of the following figures the first power measure and the second power measure are based on the energy of the sound signal.

Figure 4:
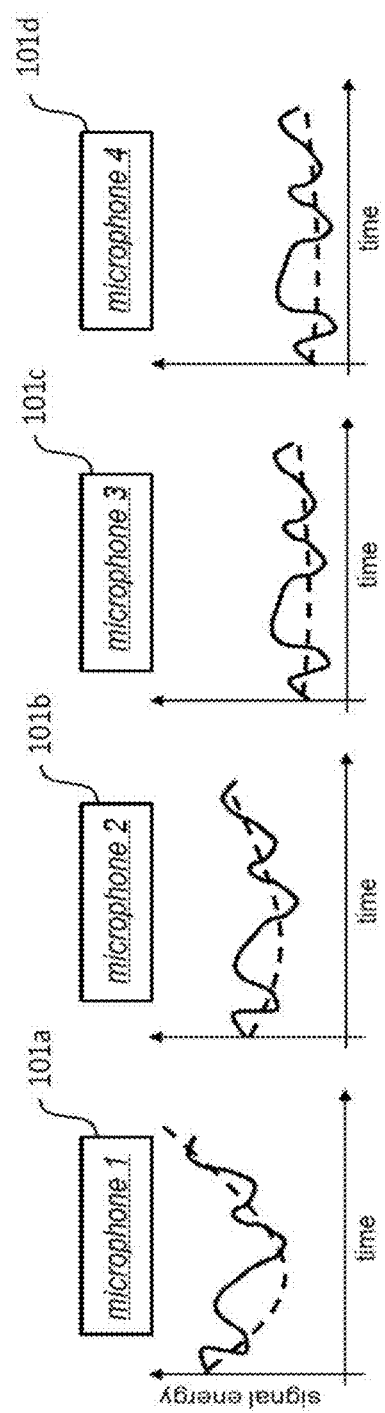
FIG. 4 illustrates a schematic diagram illustrating short time fluctuations of the signal energy as received by microphones of a sound signal processing apparatus according to an embodiment located at different distance from the target source.

FIG. 4 shows a schematic diagram illustrating the short-time signal fluctuations of the signal energy as observed by all four microphones 101a-d of the sound signal processing apparatus shown in FIG. 2, which are located at different distances from the target source. The respective solid lines represent the recorded speech energy and the respective dashed lines represent the time-varying gain due to distance variations between the target source and the respective microphone 101a-d. As can be taken from FIG. 4, the energy (or alternatively a different power measure) of the sound signal received by the different microphones 101a-d decreases with increasing distance from the target source. The signal energy received by the first microphone 101a is the highest and the signal energy captured at the microphone

101*d* is the lowest. However, the intentional short term fluctuations (shown in solid lines) of the signals are the same.

Furthermore, the unintentional short term fluctuations, e.g. due to distance variations, of the sound signals received by the different microphones 101*a-d* decrease with increasing distance from the target source, because the relative change or fluctuation of the distance, i.e. the ratio of the change (or difference) of the distance between the target source and a respective microphone 101*a-d* compared to the overall distance between the target source and the respective microphone 101*a-d*, decreases with increasing distance between the target source and the respective microphone 101*a-d*. Accordingly, as can be taken from FIG. 4, the unintentional short term fluctuations, e.g. due to distance variations (the target source first moves farther away from the microphones 101*a-d* and afterwards moves closer again), of the speech signals received by the different microphones 101*a-d* are strongest at the first microphone 101*a*, which is closest to the target source, and smaller at the other microphones 101*b-d*, which are located at a greater distance from the target source.

Since the signal at the first microphone 101*a* close to the target source and the signals at the other microphones 101*b-d* more distant from the target source have more or less identical intentional fluctuations and differ only in unintentional (distance) fluctuations, embodiments of the disclosure equalize unintentional level variations by applying a gain factor based on a ratio between a first power measure of the signal at the first microphone 101*a* and a second power measure of the signal at one of the more distant microphones 101*b-d*.

Figure 5:
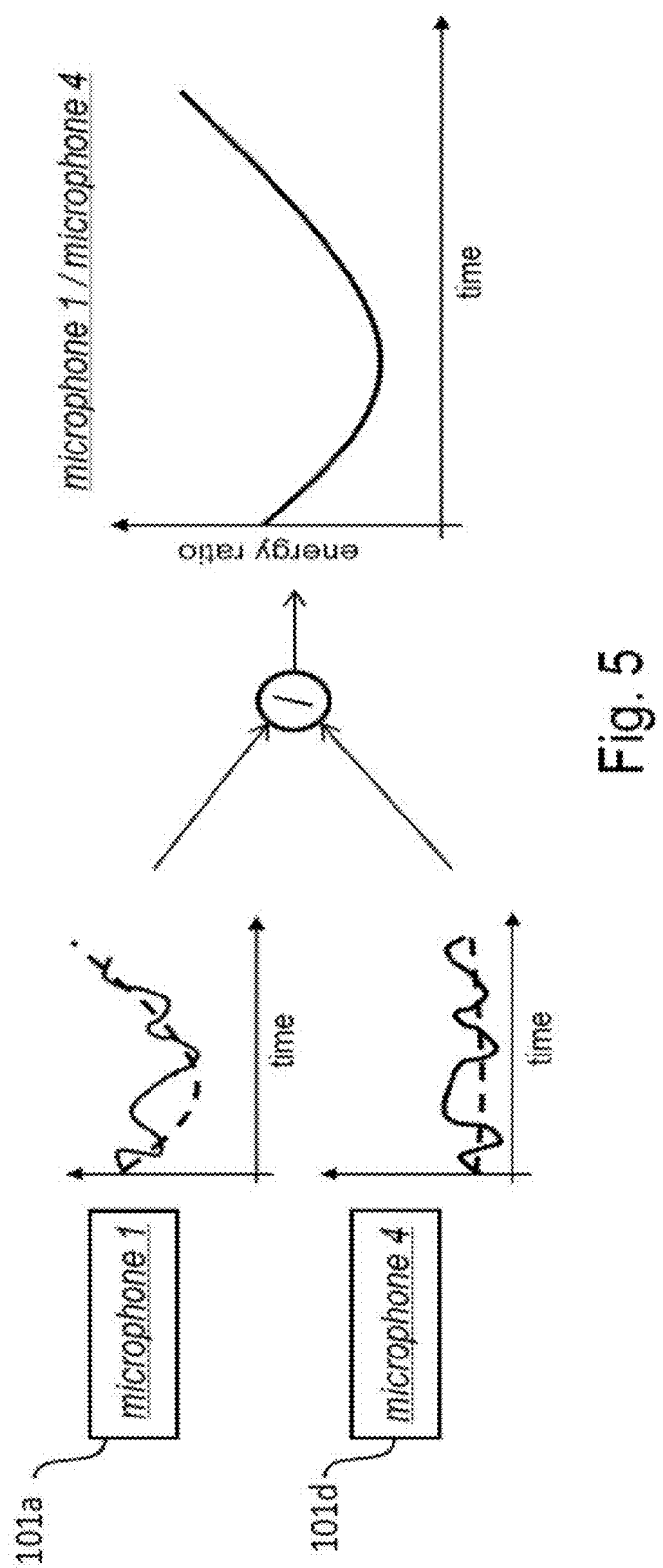
FIG. 5 illustrates a schematic diagram illustrating power measure ratio between a microphone close to the target source and a distant microphone of a sound signal processing apparatus according to an embodiment.

FIG. 5 shows a schematic diagram illustrating the power measure ratio between the first microphone 101*a* close to the target source and the more distant microphone 101*d*. Although in theory a temporal synchronization is beneficial to compensate for the time difference between the arrival of the sound signal at the first microphone 101*a* close to the target source and at the more distant microphone 101*d*, it has been found out that in practice this does not affect the result because the typical delay is very small (e.g., ~100 samples), whereas the short-time signal power measure is estimated over a longer period (e.g., ~2000 samples).

Figure 6:
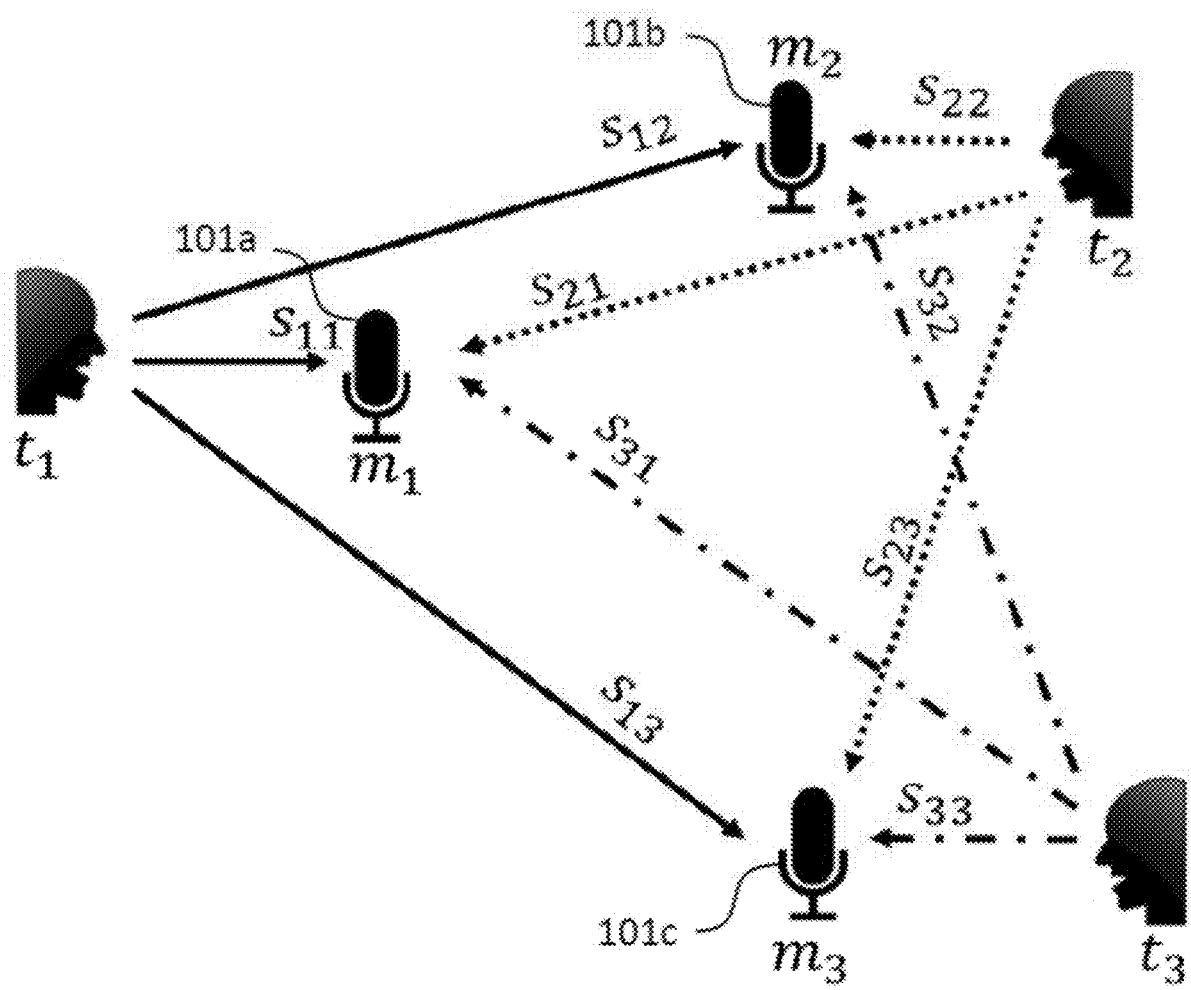
FIG. 6 illustrates a schematic diagram illustrating an exemplary scenario including a sound signal processing apparatus according to an embodiment with three microphones and three different target sources.

Embodiments of the present disclosure allow for robust and efficient estimation of the first power measure, e.g. close short-time speech energies, and the second power measure, e.g. distant short-time speech energies, even for challenging multi-talker scenarios. FIG. 6 shows an exemplary scenario including a sound signal processing apparatus 100 with three microphones 101*a-c* and three target sources (referred to as t1, t2 and t3 in FIG. 6). In this exemplary scenario there can be an active target source close to every microphone 101*a-c*. It can be assumed that the short-time signal energy at each microphone 101*a-c* can be decomposed into sound energies corresponding to the different target sources and a noise plus interference term, e.g. $m_1 = s_{11} + s_{21} + s_{31} + n_1$, where $m_1$ is the total short-time signal energy observed by the first microphone 101*a*, $s_{ij}$ is the short-time speech energy (i.e. power measure) corresponding to target source i received by microphone j, and $n_1$ is the total short-time energy of microphone self-noise, diffuse noise and interfering sources.

The first power measure $s_{ii}(n)$ (wherein n denotes the time instant) is estimated by the estimator 103 of the sound signal processing apparatus 100 on the basis of the sound signal from the i-th target source received by the i-th microphone 101*a-c*. The second power measure $s_i^d(n)$ is estimated on the basis of the sound signal from the i-th target source received by another microphone 101*a-c*, which is located more distant from the i-th target source than the i-th microphone 101*a-c*.

Figure 7:
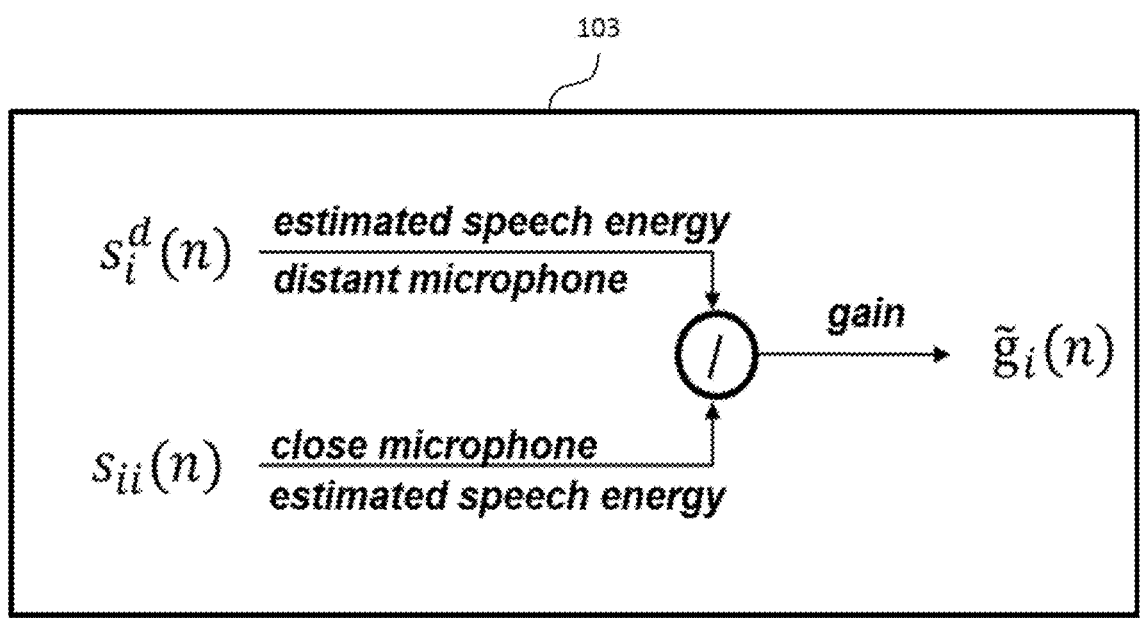
FIG. 7 illustrates a schematic diagram illustrating gain factor estimation by an estimator of a sound signal processing apparatus according to an embodiment.

FIG. 7 shows a schematic diagram illustrating the estimation of the gain factor $\tilde{g}_i(n)$ for the i-th microphone 101*a-c* by the estimator 103 of the sound signal processing apparatus 100 according to an embodiment. The gain factor $\tilde{g}_i(n)$ calculation is based on the power measures $s_{ii}(n)$ and $s_i^d(n)$. The estimator 103 of the sound signal processing apparatus 100 according to an embodiment is configured to determine the gain factor $\tilde{g}_i(n)$ for the i-th microphone 101*a-c* as a ratio between the second power measure $s_i^d(n)$ and the first power measure $s_{ii}(n)$.

As the gain factor $\tilde{g}_i(n)$ determined by the estimator 103 of the sound signal processing apparatus depends on the second power measure $s_i^d(n)$, different embodiments of the disclosure provide different ways for selecting the "distant microphone" and estimating the second power measure $s_i^d(n)$. The selected distant microphone should be far away from the target source to reduce the impact of unintentional distance variations, while still allowing for accurate estimation of the second power measure $s_i^d(n)$ in order to be able to obtain a meaningful reference signal showing the intentional fluctuations.

Thus, in the case, where a dedicated distant microphone is available, this microphone should be used by the estimator 103 of a sound signal processing apparatus 100 for estimating the second power measure $s_i^d(n)$. However, in other embodiments, where, for instance, such a dedicated distant microphone is not available, the estimator 103 of the sound signal processing apparatus 100 is configured to use (possibly weighted) statistical estimators based on the estimated power measures of all microphones to estimate the second power measure $s_i^d(n)$, as will be described in more detail further below. Determining the second power measure $s_i^d(n)$ on the basis of such statistical estimators allows, for instance, to account for abrupt gain changes when the positions of target sources and/or microphones change and to make the estimation of the second power measure more robust, as the estimation of the second power measure based on a single distant microphone is prone to errors under noisy or reverberant conditions.

In an embodiment, the statistical estimators for the second power measure $s_i^d$ are the mean or median value over all estimated power measures corresponding to one target source. However, the mean value can be prone to errors due to outliers, whereas using the median value can lead to abrupt changes of the second power measure $s_i^d$. In order to obtain a smooth estimate for the second power measure $s_i^d$ embodiments of the disclosure use the mean value between two percentile measures, as will be described in more detail further below. When a large number of microphones with reasonable spatial distribution are available, these statistical estimators are not corrupted by some microphones that are too close to the desired target source or too far away. However, if only a few microphones are available, embodiments of the disclosure can improve the robustness of the estimation of the second power measure using weighted statistical estimators. In an embodiment, for each $s_i^d$ estimation a reliability coefficient for each microphone (also referred to as spot reliability) is estimated and the power measures from microphones with low spot reliability contribute less to the value of the second power measure estimated by the estimator 103 than the power measures from microphones with a larger spot reliability.

Even if, as in the example shown in FIG. 6, there is a plurality of target sources, not all of them are necessarily active at the same time. Therefore, in an embodiment, the estimator 103 is further configured to estimate the first power measure on the basis of a plurality of band-limited power measures in a plurality of frequency bands of the sound signal from the target source received by the first microphone 101a and a plurality of probabilities defining the likelihood of the target source being active in the plurality of frequency bands.

In an embodiment, the estimator 103 is further configured to estimate the first power measure $s_{ii}$ on the basis of the following equation:

$$s_{ii} = p_i^T(n) \cdot \mathrm{diag}\{w\} \cdot x_i(n), \quad (1)$$

wherein $s_{ii}$ denotes the first power measure, w denotes a weighting vector defining a plurality of weights for the plurality of frequency bands, $x_i$ denotes a power measure vector defining the plurality of band-limited power measures in the plurality of frequency bands of the sound signal from the target source received by the first microphone 101a-c for the time instant n and $p_i(n)$ denotes a probability vector defining the plurality of probabilities for a time instant n on the basis of the following equation:

$$p_i(n) = [P_i(n,1), P_i(n,2), \ldots, P_i(n,K)]^T, \quad (2)$$

wherein $P_i(n,k)$ denotes the probability of the target source being active at the first microphone 101 a-c in a frequency band k at time instant n and wherein K denotes the number of frequency bands. The probabilities $P_i(n,k)$ are herein also referred to as "close-talker probabilities".

In an embodiment, the power measure vector $x_i(n)$ defining the plurality of band-limited power measures in the plurality of frequency bands of the sound signal from the target source received by the first microphone 101a-c during the time instant n is defined by the following equation:

$$x_i(n) = [|X_i(n,1)|^2, |X_i(n,2)|^2, \ldots, |X_i(n,K)|^2]^T, \quad (3)$$

wherein $X_i(n,k)$ denotes the intensity of the sound signal from the target source received by the first microphone 101a in a frequency band k at time instant n and wherein K denotes the number of frequency bands. In an embodiment, $X_j(n,k)$ can be the generally complex valued output of a filterbank at time instant n and in frequency subband k (e.g. obtained by a short-time Fourier transform).

In an embodiment, the estimator 103 is configured to determine the plurality of probabilities defining the likelihood of the target source being active in the plurality of frequency bands for each frequency band on the basis of a difference between the first power measure of the sound signal from the target source received by the first microphone 101a and the second power measure of the sound signal from the target source received by the second microphone 101b,c.

In an embodiment, the estimator 103 is further configured to estimate the first power measure $s_{ii}$ using the plurality of probabilities defined by the following equation:

$$P_i(n,k) = \frac{\max\{|X_i(n,k)|^2 - \max_{j \neq i}(|X_j(n,k)|^2), 0\}}{|X_i(n,k)|^2}, \quad (4)$$

wherein $P_i(n,k)$ denotes the probability that the target source is active at the first microphone 101a in a frequency band k at time instant n, $X_i(n,k)$ denotes the intensity of the sound signal from the target source received by the first microphone 101a in a frequency band k at time instant n and $X_j(n,k)$ denotes the intensity of the sound signal from the target source received by the j-th microphone 101b, 101c in a frequency band k at time instant n.

Assuming approximate spectral disjointness of the sound signals from the target sources, i.e. each time frequency slot is mostly dominated by a single target source, the probability $P_i(n,k)$ as defined before can be used to separate the power measure of the desired i-th target source from the power measures of competing target sources in above equation 4 defining the first power measure $s_{ii}$. The weighting vector w in above equation 1 can be used to emphasize certain frequency ranges.

As mentioned before, the second power measure $s_i^d(n)$ can be calculated using the estimated power measure of one distant microphone 101b, 101c, which is located more distant from the i-th target source than the i-th microphone 101a. Therefore, as already mentioned before, if a dedicated single microphone or a microphone array with sufficient distance to all target sources is available, the second power measure $s_i^d(n)$ can be estimated using these microphones.

In an embodiment, the estimator 103 is further configured to estimate the second power measure on the basis of the sound signal received by the first microphone 101a, the sound signal received by the second microphone 101b, 101c and the sound signal received by at least one further microphone 101b, 101c of the plurality of microphones 101a-c.

In an embodiment, the estimator 103 is configured to estimate the second power measure $s_i^d(n)$ further on the basis of a plurality of microphone reliability measures, wherein the microphone reliability measure of each microphone 101a-c of the plurality of microphones 101a-c depends on the distance of the microphone 101a-c to the target source and on the ratio of the strength of the sound signal from the target source to the strength of noise and/or interference signals.

In an embodiment, the second power measure $s_i^d(n)$ can be determined by the estimator 103 on the basis of the following equation:

$$s_i^d(n) = G\{s_{i:}(n), \lambda_{i:}(n)\}, \quad (5)$$

wherein $s_{i:}(n)$ denotes the vector of the power measures corresponding to the i-th target source, defined by the following equation:

$$s_{i:}(n) = [s_{i1}(n), s_{i2}(n), \ldots, s_{iM}(n)]^T, \quad (6)$$

and $\lambda_{i:}(n)$ denotes the vector of microphone reliability measures, defined by the following equation:

$$\lambda_{i:}(n) = [\lambda_{i1}(n), \lambda_{i2}(n), \ldots, \lambda_{iM}(n)]^T, \quad (7)$$

wherein $\lambda_{ij}(n)$ denotes the microphone reliability measure of the j-th microphone 101a-c with respect to the i-th target source and M denotes the total number of microphones 101a-c.

In an embodiment, the function $G\{\cdot\}$ is given by the following equation:

$$G\{s_{i:}(n), \lambda_{i:}(n)\} = \frac{\theta_{25}\{s_{i:}(n) \mid \lambda_{i:}(n)\} + \theta_{75}\{s_{i:}(n) \mid \lambda_{i:}(n)\}}{2}; \quad (8)$$

wherein $\theta_R\{v|q\}$ denotes the R-th weighted percentile of the entries in vector v given the weights in vector q.

Using the microphone reliability measures $\lambda_{ij}(n)$ of the j-th microphone 101a-c with respect to the i-th target source allows to give more weight to more reliable microphones 101a-c. For example, the most reliable estimates of the power measure $s_i^d(n)$ can be expected from microphones 101a-c that are far away from the i-th target source and still exhibit reasonable signal to noise and interference ratios. That is, the microphone reliability measure $\lambda_{ij}(n)$ is low if:

$$s_{ij}(n)/s_{jj}(n)<\delta_1 \text{ or } s_{ii}(n)/s_{ij}(n)<\delta_2, \quad (9)$$

wherein $\delta_1$ and $\delta_2$ are empirical constants. Values close to 1 may be chosen for $\delta_1$, values between 4 and 10 for $\delta_2$.

Figure 8:
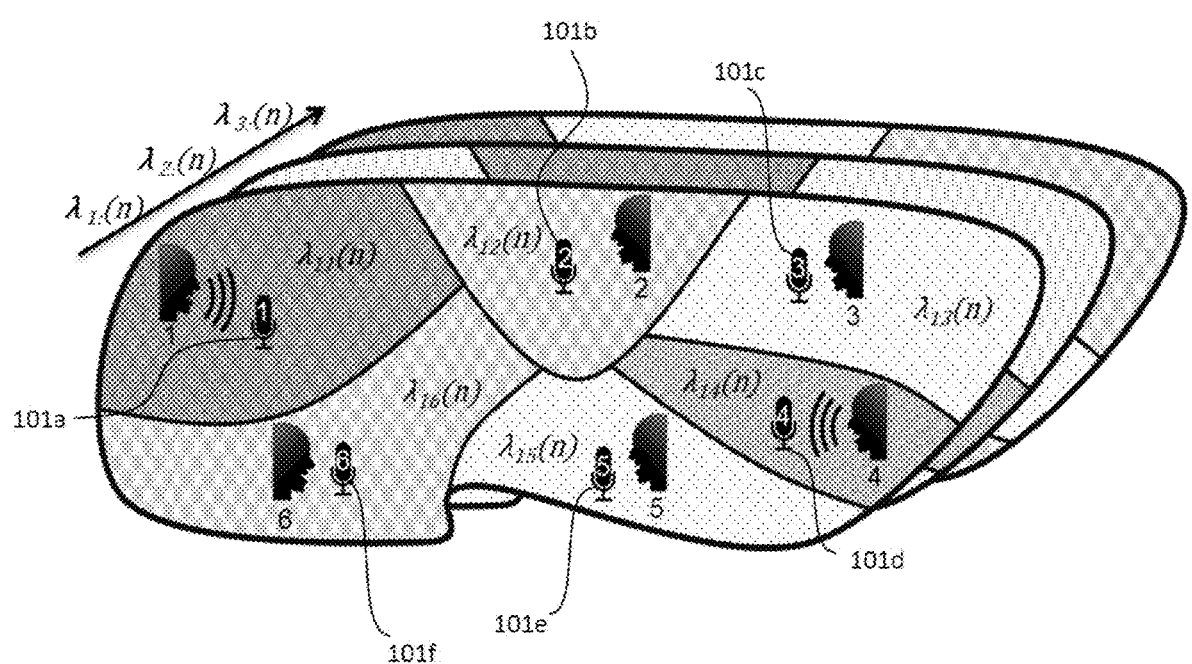
FIG. 8 illustrates a schematic diagram illustrating a microphone reliability distribution in an exemplary scenario including a sound signal processing apparatus according to an embodiment with six microphones and two active target sources.

FIG. 8 shows an exemplary distribution of microphone reliability measures $\lambda_{ij}(n)$ for a scenario with six microphones 101a-f and six target sources, two of which are active. In FIG. 8 dark areas correspond to low spot reliabilities, whereas bright areas correspond to high spot reliabilities.

As described before, in an embodiment, the one (or more) gain factors $\tilde{g}_j(n)$ are estimated under the assumption that each microphone 101a-c corresponds to an active signal target source, located close to the respective microphone. However, when the signal of the target source at the i-th microphone 101a-f is low, the corresponding gain factor should adapt smoothly. Therefore, in an embodiment, the estimator 103 of the sound signal processing apparatus 100 is further configured to determine the gain factor on the basis of the ratio between the second power measure and the first power measure by weighting the ratio with a normalized measure for the probability that the target source is active at the first microphone 101a-f during a time instant n, which is herein referred to as the frame reliability $\mu_i(n)$.

In an embodiment, the probability that the target source is active at the first microphone 101a during a time instant n is based on a plurality of probabilities that the target source is active at the first microphone 101a during a time instant n for a plurality of frequency bands.

In an embodiment, the estimator 103 is further configured to determine the frame reliability $\mu_i(n)$, i.e. the normalized measure for the probability that the target source is active at the first microphone 101a-c during a time instant n, on the basis of the following equation:

$$\mu_i(n) = \frac{w^T p_i(n)}{w^T w}, \quad (10)$$

wherein w denotes a weighting vector defining a plurality of weights for the plurality of frequency bands and $p_i(n)$ denotes a probability vector defining the plurality of probabilities that the target source is active at the first microphone 101a during a time instant n for a plurality of frequency bands. In an embodiment, the probability vector $p_i(n)$ is defined by equations (3) and (4) described above.

The weighting vector w can be chosen to emphasize important frequency regions and can be written as follows:

$$w=[w(1),w(2),\ldots,w(K)]^T, \quad (11)$$

wherein the different weights w(k) lie between zero and one, i.e. $0 \le w(k) \le 1$.

Figure 9:
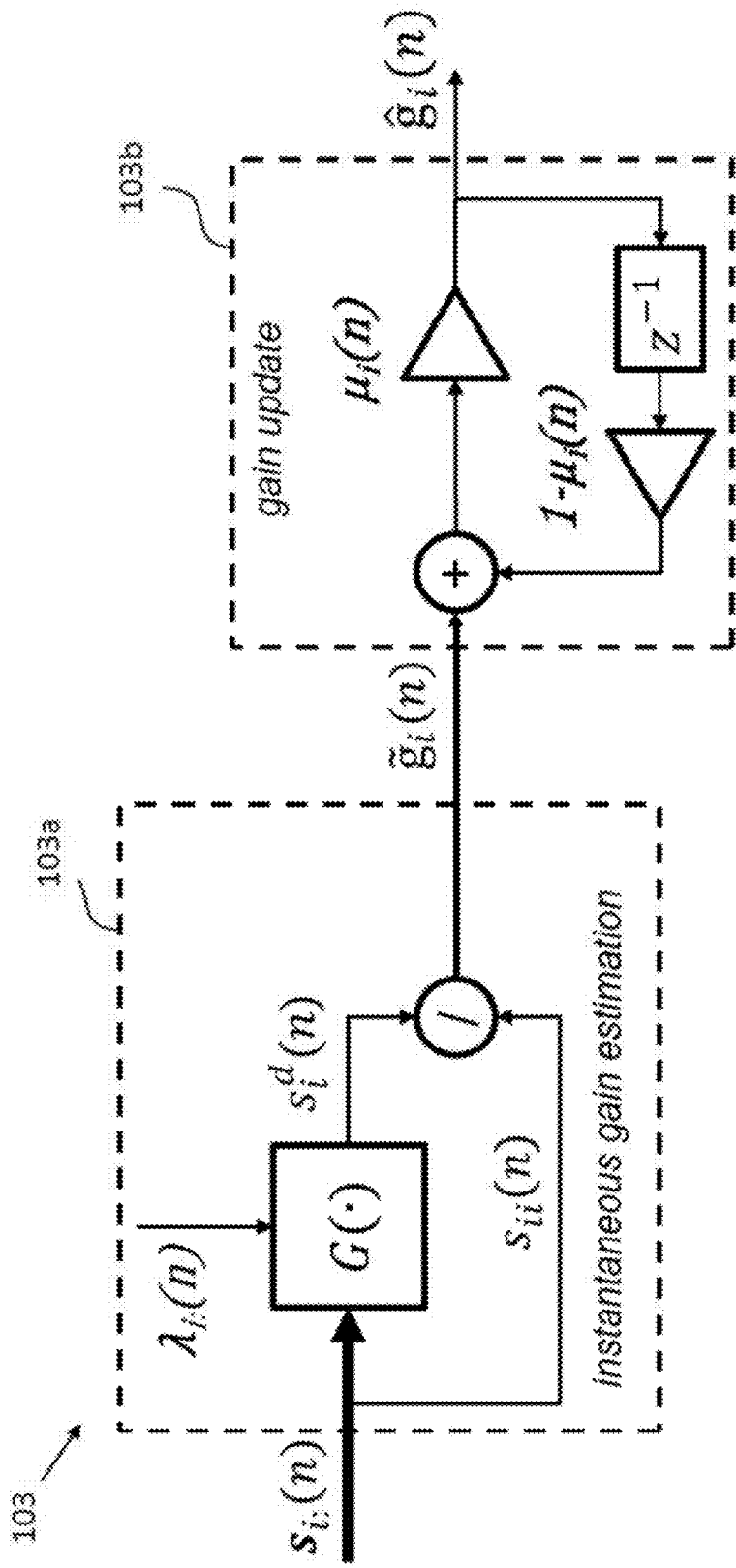
FIG. 9 illustrates a schematic diagram illustrating a gain factor estimation stage with a subsequent gain factor update stage of an estimator of a sound signal processing apparatus according to an embodiment.

In an embodiment, the frame reliability $\mu_i(n)$ can serve as the adaptation step size used in a gain factor update stage 103b of the estimator 103 of the sound signal processing apparatus 100, as shown in FIG. 9. In addition to the gain factor update stage 103b the estimator shown in FIG. 9 comprises a gain factor estimation stage 103a. FIG. 9 serves as a summary of the components of the gain factor estimation stage 103a and the gain factor update stage 103b of the estimator 103 already described above.

In case a target source is inactive, an estimation of a gain factor on the basis of such a target source can be erroneous. Therefore, in an embodiment, the amplifier 105 is configured to apply a unity gain factor to the sound signal from the target source received by the first microphone 101a, in case the frame reliability $\mu_i(n)$, i.e. the normalized measure for the probability that the target source is active at the first microphone 101a during a time instant n, is smaller than a predefined threshold value. A corresponding embodiment is shown in FIG. 10.

Figure 10:
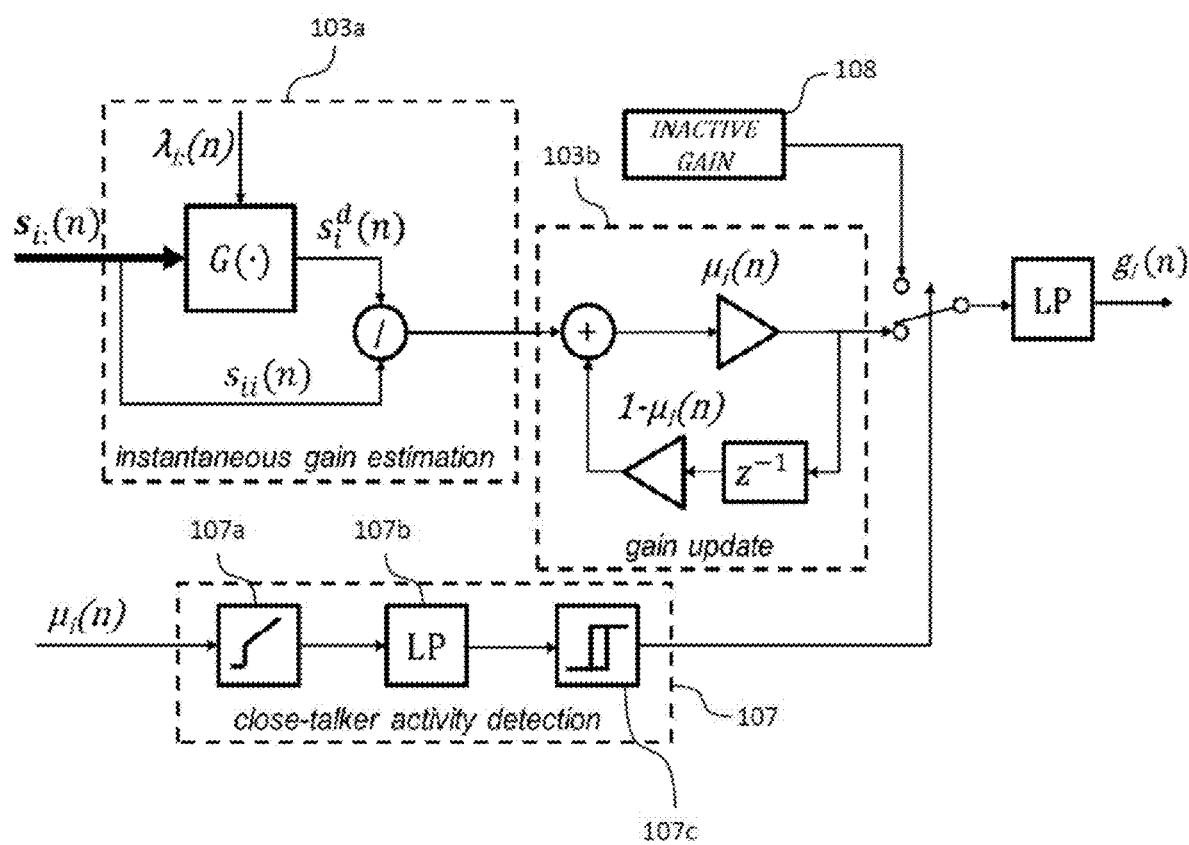
FIG. 10 illustrates a schematic diagram illustrating an estimator and an additional close-talker detection stage of a sound signal processing apparatus according to an embodiment.

Further to the components shown in FIG. 9 the sound processing apparatus 100 shown in FIG. 10 comprises a close-talker detection stage 107. The close-talker detection stage 107, which can be implemented as part of the amplifier 105, is configured to check whether the frame reliability $\mu_i(n)$, i.e. the normalized measure for the probability that the target source is active at the first microphone 101a during a time instant n, is smaller than a predefined threshold value. If this is the case, the amplifier 105 can be switched to a unity or inactive gain 108. In order to perform its function, the close-talker detection stage 107 can comprise a gating function 107a, a low pass filter 107b and/or a Schmitt trigger 107c.

Figure 11:
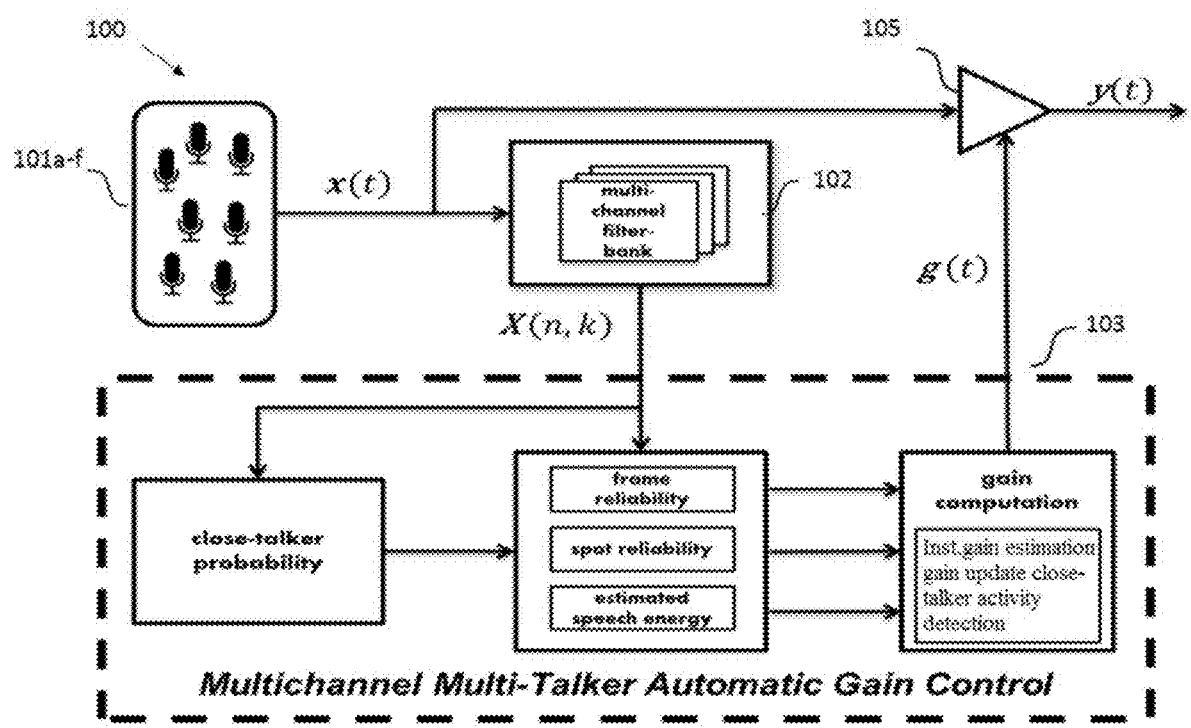
FIG. 11 illustrates a schematic diagram illustrating a sound signal processing apparatus according to an embodiment.

FIG. 11 shows a schematic diagram illustrating a sound signal processing apparatus 100 according to an embodiment. The sound signal processing apparatus 100 comprises a plurality of microphones 101a-f, a multi-channel filterbank 102 for spectrally dividing the target source sound signals, an estimator 103 and an amplifier 105. The estimator 103 and the amplifier 105 can be configured in an identical or similar way as in the previously described embodiments.

Figure 12:
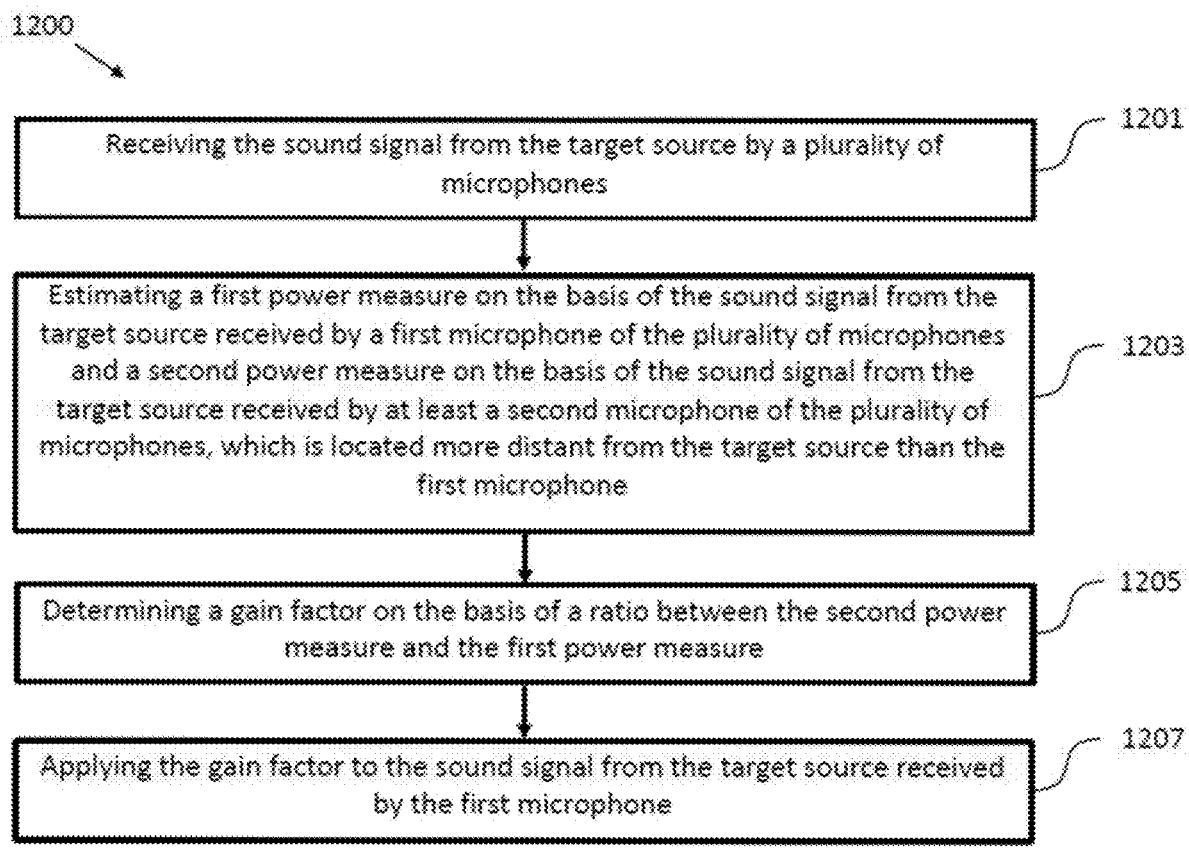
FIG. 12 illustrates a schematic diagram of a signal processing method for enhancing a sound signal from a target source according to an embodiment.

FIG. 12 shows a schematic diagram of a sound signal processing method 1200 for enhancing a sound signal from a target source.

The sound signal processing method 1200 comprises the following steps.

Step 1201: Receiving the sound signal from the target source by a plurality of microphones.

Step 1203: Estimating a first power measure on the basis of the sound signal from the target source received by a first microphone of the plurality of microphones and a second power measure on the basis of the sound signal from the target source received by at least a second microphone of the plurality of microphones, which is located more distant from the target source than the first microphone.

Step 1205: Determining a gain factor on the basis of a ratio between the second power measure and the first power measure.

Step 1207: Applying the gain factor to the sound signal from the target source received by the first microphone.

Embodiments of the disclosure realize different advantages. The sound signal processing apparatus 100 and the sound signal processing method 1200 provide means to equalize unintentional signal variations, e.g. due to the variations of distance between a target source and a microphone, while preserving the intentional signal variations.

Embodiments of the disclosure can be applied in different scenarios, for example with different number of target sources and microphones, unknown number of target sources, unknown target source positions, unknown microphone positions or non-synchronized microphones.

Embodiments of the disclosure allow for efficient gain factor estimation and update according to the activity and/or position of target sources and microphones.

The described disclosure can be implemented, for example, in a multi-microphone conference scenario, teleconferencing with multiple talkers in the same room, etc. The disclosure allows for equalizing signal level variations due to the variation of talker positions while preserving the natural (dynamic) changes of the speech signal.

While a particular feature or aspect of the disclosure may have been disclosed with respect to only one of several implementations or embodiments, such feature or aspect may be combined with one or more other features or aspects of the other implementations or embodiments as may be desired and advantageous for any given or particular application. Furthermore, to the extent that the terms "include," "have," "with," or other variants thereof are used in either the detailed description or the claims, such terms are intended to be inclusive in a manner similar to the term "comprise." Also, the terms "exemplary," "for example" and "e.g." are merely meant as an example, rather than the best or optimal. The terms "coupled" and "connected," along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the disclosure beyond those described herein. While the present disclosure has been described with reference to one or more particular embodiments, those skilled in the art recognize that many changes may be made thereto without departing from the scope of the present disclosure. It is therefore to be understood that within the scope of the appended claims and their equivalents, the disclosure may be practiced otherwise than as described herein.

What is claimed is:

1. A sound signal processing apparatus for enhancing a sound signal from a target source, comprising:
    a first microphone configured to receive the sound signal from the target source as a first sound signal;
    a second microphone configured to receive the sound signal from the target source as a second sound signal, wherein the second microphone is located farther from the target source than the first microphone;
    a processor coupled to each of the first microphone and the second microphone, wherein the processor is configured to:
        estimate a first power measure of the first sound signal based on each of a plurality of band-limited power measures in a plurality of frequency bands and a plurality of probabilities related to the frequency bands, wherein the first sound signal comprises the plurality of frequency bands, and wherein the probabilities define a likelihood of the target source being active in the frequency bands;
        estimate a second power measure of the second sound signal; and
        calculate a gain factor based on a ratio of the second power measure to the first power measure; and
    an amplifier coupled to each of the processor, the first microphone and the second microphone, wherein the amplifier is configured to apply the gain factor to the first sound signal to enhance the first sound signal.

2. The sound signal processing apparatus of claim 1, wherein the processor is further configured to estimate the first power measure based on the following equation:
    $s_{ii} = p_i^T(n) \cdot \mathrm{diag}\{w\} \cdot x_i(n)$, wherein the $s_{ii}$ denotes the first power measure, wherein the w denotes a weighting vector that defines a plurality of weights for the frequency bands, wherein the $x_i$ denotes a power measure vector that defines the band-limited power measures in the frequency bands a time instant n, and wherein the $p_i(n)$ denotes a probability vector that defines the probabilities for the time instant n based on the following equation:
    $p_i(n) = [P_i(n,1), P_i(n,2), \ldots, P_i(n,K)]^T$, wherein the $P_i(n,k)$ denotes a probability that the target source is active at the first microphone in a frequency band k at the time instant n, and wherein the K denotes a number of the frequency bands.

3. The sound signal processing apparatus of claim 1, wherein the processor is further configured to determine the probabilities that define the likelihood for each of the frequency bands based on a difference between the first power measure and the second power measure.

4. The sound signal processing apparatus of claim 2, wherein the processor is further configured to estimate the first power measure using the probabilities for the time instant n defined by the following equation:

$$P_i(n, k) = \frac{\max\{|X_i(n, k)|^2 - \max_{j \neq i}(|X_j(n, k)|^2), 0\}}{|X_i(n, k)|^2},$$

wherein the $X_i(n, k)$ denotes an intensity of the first sound signal in the frequency band k at the time instant n, and wherein the $X_j(n, k)$ denotes an intensity of the first sound signal from the target source received by a j-th microphone in the frequency band k at the time instant n.

5. The sound signal processing apparatus of claim 1, wherein the processor is further configured to estimate the second power measure based on the first sound signal, wherein the second sound signal is received by at least one other microphone.

6. The sound signal processing apparatus of claim 5, wherein the processor is further configured to estimate the second power measure based on a plurality of microphone reliability measures, wherein a microphone reliability measure of each of the first microphone and the second microphone is based on a distance of the first microphone and the second microphone to the target source and a ratio of the sound signal from the target source received by the first microphone and the second microphone to a noise signal or interference signal.

7. The sound signal processing apparatus of claim 1, wherein the ratio is weighted by a normalized measure for a probability that the target source is active at the first microphone during a time instant n.

8. The sound signal processing apparatus of claim 7, wherein the probability that the target source is active at the first microphone during the time instant n is based on a plurality of probabilities that the target source is active at the first microphone during the time instant n for the frequency bands.

9. The sound signal processing apparatus of claim 8, wherein the processor is further configured to determine the normalized measure based on the following equation:

$$\mu_i(n) = \frac{w^T p_i(n)}{w^T w},$$

wherein the $\mu_i(n)$ denotes the normalized measure wherein the w denotes a weighting vector that defines a plurality of weights for the frequency bands, and wherein the $p_i(n)$ denotes a probability vector that defines the probabilities that the target source is active at the first microphone during the time instant n for the frequency bands.

10. The sound signal processing apparatus of claim 9, wherein the $p_i(n)$ is defined by the following equation:

$$p_i(n) = [P_i(n,1), P_i(n,2), \ldots, P_i(n,K)]^T,$$

wherein the $P_i(n,k)$ denotes the probability of the target source being active at the first microphone in a frequency band k at the time instant n, wherein the K denotes a number of frequency bands, wherein the $P_i(n,k)$ is based on the following equation:

$$P_i(n, k) = \frac{\max\{|X_i(n, k)|^2 - \max_{j \neq i}(|X_j(n, k)|^2), 0\}}{|X_i(n, k)|^2},$$

wherein the $X_i(n,k)$ denotes an intensity of the first sound signal in the frequency band k at the time instant n, and wherein the $X_j(n,k)$ denotes an intensity of the sound signal from the target source received by a j-th microphone in the frequency band k at the time instant n.

11. The sound signal processing apparatus of claim 1, wherein the amplifier is further configured to apply a unity gain factor to the first sound signal, wherein a normalized measure for a probability that the target source is active at the first microphone during a time instant n is smaller than a predefined threshold value.

12. The sound signal processing apparatus of claim 1, wherein the amplifier is further configured to:
apply a unity gain factor to the first sound signal, wherein a normalized measure for a probability that the target source is active at the first microphone during a time instant n is smaller than a predefined probability threshold value; and
apply either a gating function, a low pass filter or a Schmitt trigger to the normalized measure.

13. A sound signal processing method for enhancing a sound signal from a target source, comprising:
receiving, by a first microphone, the sound signal from the target source as a first sound signal;
receiving, by a second microphone, the sound signal from the target source as a second sound signal, wherein the second microphone is located farther from the target source than the first microphone;
estimating a first power measure of the first sound signal based on each of a plurality of band-limited power measures in a plurality of frequency bands and a plurality of probabilities related to the frequency bands, wherein the first sound signal comprises the plurality of frequency bands, and wherein the probabilities define a likelihood of the target source being active in the frequency bands;
estimating a second power measure of the second sound signal;
determining a gain factor based on a ratio of the second power measure to the first power measure;
applying the gain factor to the first sound signal; and
enhancing the first sound signal based on applying the gain factor to the first sound signal.

14. The sound signal processing method of claim 13, further comprising estimating the first power measure based on the following equation:
$s_{ii} = p_i^T(n) \cdot \text{diag}\{w\} \cdot x_i(n)$, wherein the $s_{ii}$ denotes the first power measure, wherein the w denotes a weighting vector that defines a plurality of weights for a plurality of frequency bands of the sound signal, wherein the $x_i$ denotes a power measure vector that defines the band-limited power measures in the frequency bands for a time instant n, wherein the $p_i(n)$ denotes a probability vector that defines a plurality of probabilities for the time instant n based on the following equation:
$p_i(n) = [P_i(n,1), P_i(n,2), \ldots, P_i(n,K)]^T$, wherein the $P_i(n,k)$ denotes a probability of the target source is active at the first microphone in a frequency band k at the time instant n, and wherein the K denotes a number of frequency bands.

15. The sound signal processing method of claim 14, further comprising estimating the first power measure using the probabilities defined by the following equation:

$$P_i(n, k) = \frac{\max\{|X_i(n, k)|^2 - \max_{j \neq i}(|X_j(n, k)|^2), 0\}}{|X_i(n, k)|^2},$$

wherein the $X_i(n,k)$ denotes an intensity of the first sound signal in the frequency band k at the time instant n, and wherein the $X_j(n, k)$ denotes an intensity of the sound signal from the target source received by a j-th microphone in the frequency band k at the time instants n.

16. The sound signal processing method of claim 13, wherein the ratio is weighted by a normalized measure for a probability that the target source is active at the first microphone during a time instant n.

17. The sound signal processing method of claim 16, wherein the probability is based on a plurality of probabilities that the target source is active at the first microphone during the time instant n for the frequency bands.

18. The sound signal processing method of claim 17, further comprising determining the normalized measure for the probability that the target source is active at the first microphone during the time instant n is based on the following equation:

$$\mu_i(n) = \frac{w^T p_i(n)}{w^T w},$$

wherein the $\mu_i(n)$ denotes the normalized measure wherein the w denotes a weighting vector that defines a plurality of weights for the frequency bands, and wherein the $p_i(n)$ denotes a probability vector that defines the probabilities for the frequency bands.

19. A non-transitory computer-readable storage medium storing a program code, wherein the program code comprises instructions that when executed by a processor of a sound signal processing apparatus causes the sound signal processing apparatus to:

receive, from a target source, a sound signal by a first microphone as a first sound signal;

receive, from the target source, the sound signal by a second microphone as a second sound signal, wherein the second microphone is located farther from the target source than the first microphone;

estimate a first power measure of the first sound signal based on each of a plurality of band-limited power measures in a plurality of frequency bands and a plurality of probabilities related to the frequency bands, wherein the first sound signal comprises the plurality of frequency bands, and wherein the probabilities define a likelihood of the target source being active in the frequency bands;

estimate a second power measure of the second sound signal;

determine a gain factor based on a ratio of the second power measure to the first power measure; and apply the gain factor to the first sound signal to enhance the sound signal.

20. The non-transitory computer-readable storage medium of claim 19, wherein the instructions further cause the sound signal processing apparatus to estimate the first power measure based on the following equation:

$s_{ii} = p_i^T(n) \cdot \text{diag}\{w\} \cdot x_i(n)$, wherein the $s_{ii}$ denotes the first power measure, wherein the w denotes a weighting vector that defines a plurality of weights for a plurality of frequency bands of the sound signal, wherein the x denotes a power measure vector that defines the band-limited power measures in the frequency bands for a time instant n, wherein the $p_i(n)$ denotes a probability vector that defines a plurality of probabilities for the time instant n based on the following equation:

$p_i(n) = [P_i(n,1), P_i(n,2), \ldots, P_i(n,K)]^T$, wherein the $P_i(n,k)$ denotes a probability of the target source is active at the first microphone in a frequency band k at the time instant n, and wherein the K denotes a number of frequency bands.

\* \* \* \* \*

UNITED STATES PATENT AND TRADEMARK OFFICE
CERTIFICATE OF CORRECTION

PATENT NO. : 10,602,267 B2
APPLICATION NO. : 15/978688
DATED : March 24, 2020
INVENTOR(S) : Peter Grosche et al.

Page 1 of 1

It is certified that error appears in the above-identified patent and that said Letters Patent is hereby corrected as shown below:

In the Claims

Claim 2, Column 18, Line 17: "bands a time" should read "bands for a time"

Claim 9, Column 19, Line 14: "measure wherein" should read "measure n, wherein"

Claim 17, Column 20, Line 47: "probability is based on" should read "probability n is based on"

Claim 18, Column 20, Line 64: "probabilities for" should read "probabilities n for"

Claim 20, Column 22, Line 10: "the x" should read "the $x_i$"

Signed and Sealed this
Twenty-sixth Day of May, 2020

Andrei Iancu
*Director of the United States Patent and Trademark Office*